United States Patent
Kobayashi et al.

(10) Patent No.: US 6,715,688 B2
(45) Date of Patent: Apr. 6, 2004

(54) CONTACTLESS IC CARD

(75) Inventors: Izumi Kobayashi, Kawasaki (JP); Takanori Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 59 days.

(21) Appl. No.: 09/906,148

(22) Filed: Jul. 17, 2001

(65) Prior Publication Data
US 2002/0053598 A1 May 9, 2002

(30) Foreign Application Priority Data
Aug. 30, 2000 (JP) ........................................ 2000-261597

(51) Int. Cl.⁷ ................................................ G06K 19/06
(52) U.S. Cl. ........................................ 235/492; 235/441
(58) Field of Search ................... 235/380, 492, 235/488, 487, 449, 486, 491; 324/244, 248, 249

(56) References Cited

U.S. PATENT DOCUMENTS

| | | | | |
|---|---|---|---|---|
| 5,437,276 A | * | 8/1995 | Takada | 324/244 |
| 5,852,289 A | * | 12/1998 | Masahiko | 235/492 |
| 6,049,461 A | * | 4/2000 | Haghiri-Tehrani et al. | 235/492 |
| 6,073,856 A | * | 6/2000 | Takahashi | 235/441 |
| 6,160,526 A | * | 12/2000 | Hirai et al. | 235/491 |
| 6,412,701 B1 | * | 7/2002 | Kohama et al. | 235/488 |
| 6,478,228 B1 | * | 11/2002 | Ikefuji et al. | 235/492 |
| 2001/0040186 A1 | * | 11/2001 | Okada | 235/492 |

FOREIGN PATENT DOCUMENTS

JP 11-195095 7/1999

* cited by examiner

Primary Examiner—Thien M. Le
Assistant Examiner—Edwyn Labaze
(74) Attorney, Agent, or Firm—Armstrong, Westerman & Hattori, LLP

(57) ABSTRACT

An improved contactless integrated circuit (IC) card having one or more laminate members, a wire-wound coil provided on the laminate member for receiving power and for transmitting and receiving signals to and from an external device, and an IC module for inputting and outputting the signals, the wire-wound coil being coupled to the IC module, wherein the improvement comprises an end portion of the wire-wound coil being formed into a buffer portion near the point at which the wire-wound coil is coupled to the IC module so as to absorb tension generated in the wire-wound coil.

25 Claims, 7 Drawing Sheets

FIG.12

| NO.OF TURNS | RESONANCE FREQUENCY (MHz) | COMPARATIVE EXAMPLE COMMUNICATION RANGE (mm) | EMBODIMENT OF THE INVENTION COMMUNICATION RANGE (mm) |
|---|---|---|---|
| 2 | 17.0 | 3.1 | 3.8 |
| 3 | 13.59 | 4.6 | 5.8 |
| 4 | 12.0 | 6.3 | 7.0 |

CONTACTLESS IC CARD

BACKGROUND OF THE INVENTION

1. Field of the Invention

The present invention relates to a contactless integrated circuit (hereinafter IC) card, and more particularly, to a contactless IC card containing a built-in coil antenna for transmitting and/or receiving signals to and from an external device.

2. Description of Related Art

Conventionally, IC cards are widely used to control access to a variety of facilities, to record consumer transactions, and to function as a form or medium of exchange, among other applications Such cards, which perform the dual functions of transceiving signals and also of receiving power from the external device, are of two types: A contact IC card, requiring physical contact between the IC card and the external device in order to power the IC card and to exchange information with the external device, and a contactless IC card, which is powered by a process of electromagnetic induction from the external device and which exchanges information with the external device by transmitting and receiving electromagnetic waves (radio waves) to and from the external device.

Such contactless IC cards operate by using a wire-wound coil antenna for gaining power from the external device and for transmitting and/or receiving electromagnetic signals to and from the external device.

In an earlier phase of the conventional art, the wire-wound coil antenna was formed by printing or electroplating a conductive film.

However, there are several disadvantages to this process, including the fact that the electrical resistance of such a film is generally greater than at least that of a copper wire coil, which is undesirable.

As a result, wound coils of copper wire came to replace the electroplated films.

In order to further facilitate an understanding of the present invention, a description will first be given of a conventional contactless IC card using such a wound coil of copper wire as an antenna.

FIG. 1 is an exploded view of a conventional contactless IC card. FIG. 2 is a top view of an inlet laminate (hereinafter inlet laminate) of a conventional contactless IC card. FIG. 3 is a diagram illustrating the problem with the conventional contactless IC card.

As can be seen from the diagrams, a contactless IC card 1 comprises an inlet laminate 2, plastic laminates 3 and 4 (hereinafter plastic laminates), an IC module 5, and a wire-wound coil antenna 6 (hereinafter wire-wound coil 6).

The IC module 5 and the wire-wound coil 6 are provided on the inlet laminate 2. The IC module 5 is fixedly mounted on the inlet laminate 2 using an adhesive agent. Additionally, the IC module 5 has a pair of electrodes 7, 8 to which the wire-wound coil 6 is connected.

Additionally, the wire-wound coil 6 is formed into a loop around the outer edge of the inlet laminate 2. The wire-wound coil 6 is designed to have an inductance and number of turns so as to resonate at a predetermined frequency.

As shown in FIG. 3, end portions 6A, 6B of the wire-wound coil 6 are attached by soldering 9 to the electrodes 7, 8 provided on the IC module 5. The end portions 6A, 6B are bent at substantially a right angle to the coil portion of the wire-wound coil 6 and connected to the electrodes 7, 8 of the IC module 5, with the end portions 6A, 6B forming essentially a straight line in the vicinity of the IC module 5.

The inlet laminate 2 having the structure described above is enclosed by a pair of plastic laminates 3, 4 to which the inlet laminate 2 is thermobonded, such that the three laminates together form a single unit with the IC module 5 and the wire-wound coil 6 imbedded within the structure so formed by the three laminates.

The IC card 1 may be of a type that is used either by attachment to an external device not shown in the diagrams (for example a reader/writer) or used in proximity to the external device, as indicated above. In either use state, electrical power is supplied to the IC card 1 by a process of electromagnetic induction from the external device to the IC card 1, and further, information is transmitted between the IC card 1 and the external device by use of electromagnetic waves (i.e., radio waves).

However, a disadvantage of the conventional IC card 1 having the structure described above is that, typically, the IC card 1 is carried from place to place and used in a variety of conditions in which there is a great deal of variation in temperature. For example, an IC card left inside a car exposed to the midsummer sun can be exposed to temperatures exceeding 50° C. Conversely, depending on the climate, in winter the IC card could be exposed to temperatures as low as several tens of degrees below 0°.

Accordingly, such IC cards are exposed to temperature cycle tests in order to test their reliability, the temperature cycles ranging from a low of −30° C. to room temperature, and from room temperature to 70°C.

However, when subjected to such stress tests many of the conventional IC cards such as the IC card 1 described above exhibit the following problem, in that the straight part of the end portions 6A, 6B of the wire-wound coil 6 tends to snap at a point indicated substantially as B in FIG. 3.

The above-describing parting or breakage in the wire-wound coil appears to be due to several factors, as follows:

1. There is a sharp difference in the coefficient of thermal expansion (hereinafter referred to as a coefficient of thermal expansion mismatch) between the copper wire that forms the wire-wound coil 6 and the laminates 2–4. The coefficient of thermal expansion of the copper wire is $17 \times 10^{-6}$ and the coefficient of thermal expansion of the plastic substrate is $50 \times 10^{-6}$.

2. The IC module 5 to which the ends of the coil 6A, 6B are connected is imbedded within the laminates 2–4 which are thermobonded together, and hence the IC module 5 cannot move.

3. The portions of the end portions of the coil 6A, 6B near the IC module 5 are straight, so the coil end portions 6A, 6B cannot absorb the tension generated at the coil end portions 6A, 6B due to the above-described coefficient of thermal expansion mismatch.

Additionally, in the process of manufacturing the above-described IC card 1 the laminates 2–4 are thermobonded together, a process which also imparts tension to the wire-wound coil 6. Therefore breakage of the end portions 6A, 6B of the wire-wound coil occurs during this thermobonding process as well.

BRIEF SUMMARY OF THE INVENTION

Accordingly, it is an object of the present invention to provide an improved and useful contactless IC card in which the above-described disadvantage is eliminated, and more specifically, to provide an improved and useful contactless IC card in which changes in ambient temperature do not cause the wire-wound coil to snap.

The above-described object of the present invention is achieved by an improved contactless IC card of the type having one or more laminate members, a wire-wound coil provided on the laminate member for receiving power and for transmitting and receiving signals to and from an external device, and an IC module for inputting and outputting the signals, the wire-wound coil being coupled to the IC module, wherein the improvement comprises an end portion of the wire-wound coil being formed into a buffer portion near the point at which the wire-wound coil is coupled to the IC module so as to absorb tension generated in the wire-wound coil.

According to this aspect of the invention, the buffer portion absorbs tension generated in the wire-wound coil due to the coefficient of thermal expansion mismatch between the copper wire that forms the coil and the surrounding plastic laminates.

BRIEF DESCRIPTION OF THE DRAWINGS

These and other objects, features, aspects and advantages of the present invention will become better understood and more apparent from the following description, appended claims and accompanying drawings, in which:

FIG. 12 is a chart illustrating the operation of the contactless IC card according to the seventh embodiment of the present invention.

DETAILED DESCRIPTION OF THE INVENTION

A description will now be given of embodiments of the present invention, with reference to the accompanying drawings. It should be noted that identical or corresponding elements in the embodiments are given identical or corresponding reference numbers in all drawings, with detailed descriptions of such elements given once and thereafter omitted.

Figure 4:
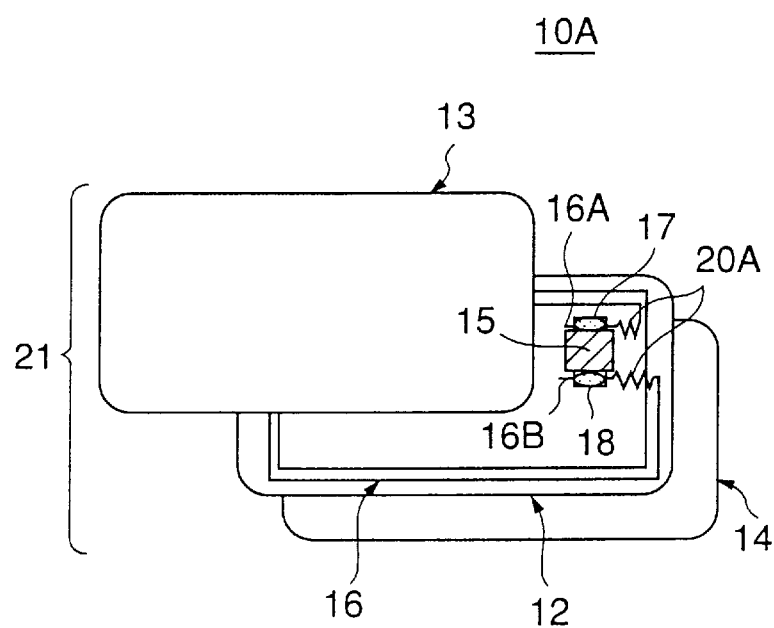
FIG. 4 is an exploded view of a contactless IC card according to a first embodiment of the present invention.
Figure 5:
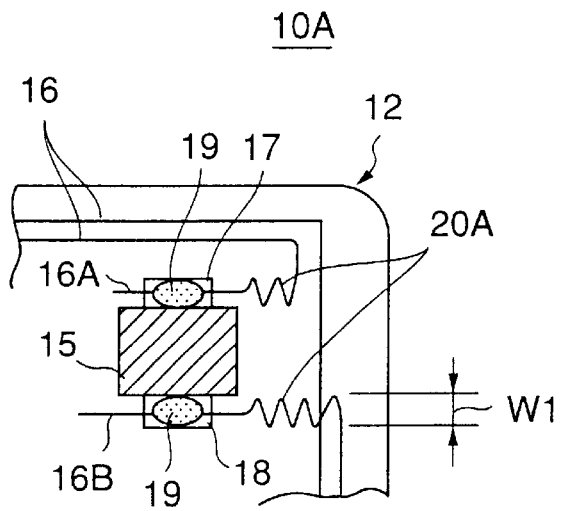
FIG. 5 is an expanded plan view of the module area of a contactless IC card according to a first embodiment of the present invention.

FIG. 4 is an exploded view of a contactless IC card according to a first embodiment of the present invention. FIG. 5 is an expanded plan view of the module area of a contactless IC card according to a first embodiment of the present invention. For convenience of explanation only, FIG. 5 as well as subsequent FIGS. 6, 7, 8, 9, 10 and 11 show only the inlet laminate 12 and not the plastic laminates 13, 14.

As can be seen from the drawings, the basic structure of the IC card 10A according to the first embodiment of the present invention is essentially the same as that of the conventional IC card described above, comprising chiefly an inlet laminate 12, plastic laminates 13, 14, an IC module 15, and a coil 16.

The inlet laminate 12 and the plastic laminates 13, 14 are made of a plastic material such as polyvinyl chloride (PVC), polycarbonate (PC) or polyethylene terephthalate (PET). As will be described later, these laminates 12–14 are thermobonded together to form a single unit referred to herein as the card body 21. It should be noted that the laminates 12–14 have a coefficient of thermal expansion on the order of, for example, $50 \times 10^{-6}$.

The IC module 15 mounts an IC chip in a lead frame and connects the lead frame and chip by wire bonding the two together, after which the whole package is sealed with an epoxy resin or other appropriate plastic material. A portion of the lead frame projects from the package sealant, and it is on this projecting portion of the lead frame that electrodes 17, 18 are formed to which a wire-wound coil 16 (to be described later) is connected. The IC module 15 is then fixedly mounted on the inlet laminate 12 using an adhesive agent.

The wire-wound coil 16 consists of copper wire sheathed in a polyurethane resin, and has a diameter of 0.08 to 0.14 mm. The wire-wound coil 16 is designed to have an inductance and number of turns so as to resonate at a predetermined frequency.

Additionally, the wire-wound coil 16 is formed into a loop around the outer edge of the inlet laminate 12, with edge portions 16A, 16B being connected by soldering 19 to electrodes 17, 18 provided on the IC module 15 (see FIG. 5). Further, the wire-wound coil 16 is embedded in the inlet laminate 12.

As can be appreciated by those skilled in the art, the wire-wound coil 16 need not necessarily consist of copper wire but may instead be another electrically conductive metal such as gold or aluminum. Additionally, the edge portions 16A, 16B of the wire-wound coil 16 need not necessarily be soldered to the electrodes 17, 18 of the IC module 15 but may instead be connected by other fusing methods such as pulse heat, etc.

Forming the card body 21 by fusing the individual laminates 12–14 involves thermobonding the plastic laminates 13, 14 together with the inlet laminate 12 sandwiched in between so as to form the laminates 12–14 into a single unit. In so doing, the IC module 15 and the wire-wound coil 16 are imbedded within the card body 21 formed by the thermobonding of the laminates 12–14. As a result, the IC module 15 is fixed within the card body 21 and does not move.

The above-described IC card 10A can either be loaded into the external device not shown in the diagram (in this case a reader/writer) or brought into proximity thereto. In such a use state, electrical power is supplied to the IC card 10A from the external device by electromagnetic induction, and additionally, information is exchanged between the IC card 10A and the external device using electromagnetic waves (radio waves).

More specifically, the external device is equipped with an electromagnetic induction coil for supplying power to the IC card 10A as well as an antenna for transmitting information to and receiving information from the IC card 10A. The magnetic field generated by this electromagnetic induction coil in the external device generates an electromotive force in the wire-wound coil 16 of the IC card 10A, and this induced electromotive force acts as the power source for the IC card 10A. Additionally, the wire-wound coil 16 also functions as an antenna for transmitting information to and receiving information from the external device.

A more detailed description will now be given of the edge portions of the wire-wound coil 16, such edge portions being the locus of the present invention.

As described above, in the conventional art the end portions 6A, 6B of the wire-wound coil 6 are attached by soldering 9 to the electrodes 7, 8 provided on the IC module 5. The end portions 6A, 6B are bent at substantially a right angle to the coil portion of the wire-wound coil 6 and connected to the electrodes 7, 8 of the IC module 5, with the end portions 5A, 6A forming essentially a straight line in the vicinity of the IC module 5.

By contrast, in the contactless IC card 10A according to one embodiment of the present invention, the coil end portions 16A, 16B positioned in the vicinity of the connection to the IC module 15 is provided with a buffer portion for absorbing tension generated in the wire-wound coil 16. More specifically, as shown in the enlarged view of FIG. 5, the coil end portions 16A, 16B each have a buffer portion 20A formed into substantially a wave-like form.

As described above, the copper wire that forms the wire-wound coil 16 has a coefficient of thermal expansion of $17 \times 10^{31}$ $^6$. As a result, the wire-wound coil 16 is subjected to either an expanding (tensioning) force or contracting (shrinking) force due to the coefficient of thermal expansion mismatch between the copper wire and the laminates 12–14. Additionally, when the contactless IC card 10A is manufactured and the laminates 12–14 subjected to thermobonding, the thermobonding process itself also subjects the wire-wound coil 16 to the same tensioning and contracting forces.

A contracting force does not act in a direction that would break the coil end portions 16A, 16B, and hence does not adversely affect the wire-wound coil 16. However, a tensioning force does act in a direction that could break the coil end portions 16A, 16B.

In particular, the coil end portions 16A, 16B are connected to the electrodes 17, 18 of the IC module 15 which is fixedly mounted in the card body 21, so, as noted previously, when tension is generated it is the coil end portions 16A, 16B positioned in the vicinity of the IC module 15 that part most easily.

However, in the contactless IC card 10A according to one embodiment of the present invention, as noted previously, wave-shaped buffer portions 20A that absorb tension arising in the wire-wound coil 16 are formed in the coil end portions 16A, 16B that are most susceptible to parting due to tension in the wire-wound coil 16. The buffer portions 20A according to the present embodiment are shaped into the form of a wave, undulating along the surface of the inlet laminate 12. The amplitude of the wave, which is designated in FIG. 5 by the arrow W1, is approximately 1.0 mm to 2.0 mm in a case in which, as here, the diameter of the wire of the wire-wound coil 16 is 0.08 mm to 0.14 mm.

In such a configuration as described above, any tension generated in the wire-wound coil 16 due to the coefficient of thermal expansion mismatch between the laminates 12–14 and the wire-wound coil 16 or due to the thermobonding process carried out during manufacture of the contactless IC card 10A is absorbed by the wave-shaped buffer portions 20A.

More specifically, when tension is imparted to the coil end portions 16A, 16B due to the coefficient of thermal expansion mismatch between the laminates 12–14 and the wire-wound coil 16 or due to the thermobonding process carried out during manufacture of the contactless IC card 10A, the wave-shaped buffer portions 20A stretch together with the inlet laminate 12, thereby efficiently cushioning impact of the tension. Therefore any breakage or parting of the end portions 16A, 16B of the wire-wound coil 16 can be prevented and the reliability of the contactless IC card 10A can be improved.

A description will now be given of a contactless IC card according to a second embodiment of the present invention, with reference to FIG. 6.

Figure 6:
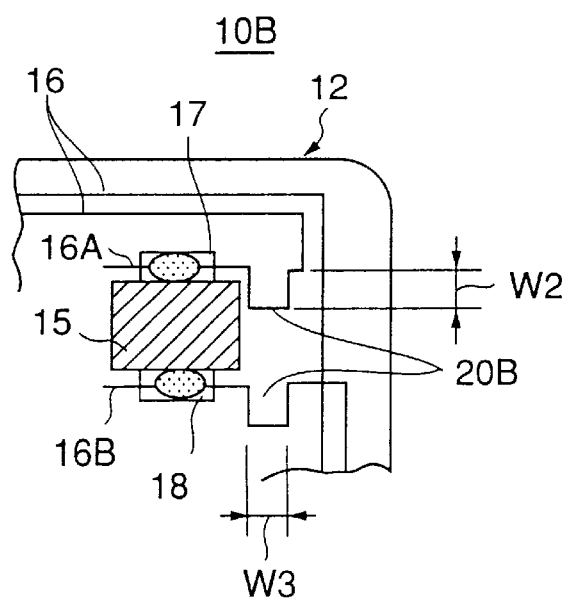
FIG. 6 is an expanded plan view of the module area of a contactless IC card according to a second embodiment of the present invention.

FIG. 6 is an expanded plan view of the module area of a contactless IC card 10B according to a second embodiment of the present invention.

As shown in the diagram, end portions 16A, 16B of the wire-wound coil 16 near the IC module 15 have been formed into U-shaped buffer portions 20B. The U-shaped buffer portions 20B have a vertical width W2 and a horizontal width W3 of approximately 2.0 mm each, in a case in which, as here, the diameter of the wire of the wire-wound coil 16 is 0.08 mm to 0.14 mm.

In the above-described structure as well, the U-shaped buffer portions 20B deform so as to absorb any tension generated in the wire-wound coil 16 due to the coefficient of thermal expansion mismatch between each of the laminates 12–14 on the one hand and the wire-wound coil 16 on the other, or due to the thermobonding process during manufacture of the contactless IC card 10B. Therefore any breakage or parting of the end portions 16A, 16B of the wire-wound coil 16 can be prevented and the reliability of the contactless IC card 10B can be improved.

Figure 7:
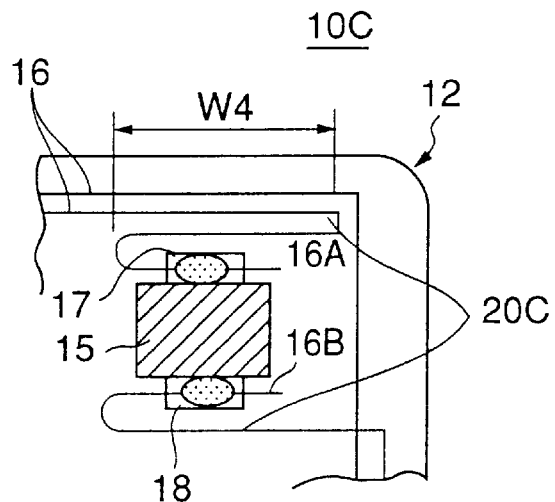
FIG. 7 is an expanded plan view of the module area of a contactless IC card according to a third embodiment of the present invention.

A description will now be given of a contactless IC card 10C according to a third embodiment of the present invention, with reference to FIG. 7.

As shown in the diagram, each of the end portions 16A, 16B of the wire-wound coil 16 near the IC module 15 have been formed so as to have a buffer portion thereof that loops back upon itself 20C, thus absorbing any tension arising in the wire-wound coil 16 and thereby preventing breakage or parting of the wire-wound coil 16. The extent of these looped buffer portions 20C (shown as W4 in FIG. 7) is approximately 10.0 mm where, as here, the diameter of the wire of the wire-wound coil 16 is 0.08 mm to 0.14 mm.

In the structure described above, any tension generated in the wire-wound coil 16 is absorbed by the looped buffer portions 20C. Therefore any breakage or parting of the end portions 16A, 16B of the wire-wound coil 16 can be prevented and the reliability of the contactless IC card 10C can be improved.

A description will now be given of a fourth embodiment of the present invention, with reference to FIG. 8.

Figure 8:
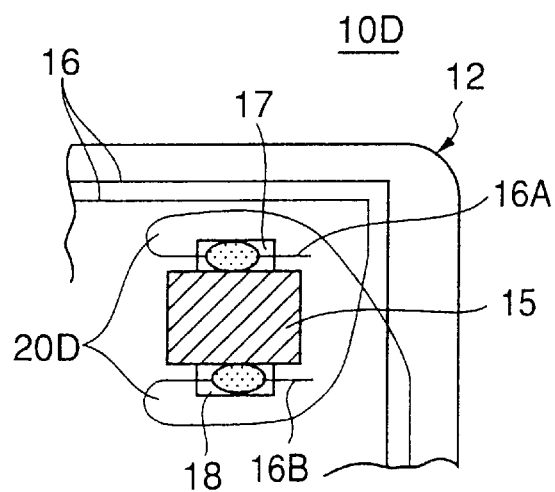
FIG. 8 is an expanded plan view of the module area of a contactless IC card according to a fourth embodiment of the present invention.

FIG. 8 is an expanded plan view of the module area of a contactless IC card 10D according to a fourth embodiment of the present invention.

As shown in the diagram, the end portions 16A, 16B of the wire-wound coil 16 near the IC module 15 are bent so as to cross each other, thus forming a buffer portion 20D.

In the above-described structure as well, the crossed buffer portion 20D deforms so as to absorb any tension generated in the wire-wound coil 16 due to the coefficient of thermal expansion mismatch between each of the laminates 12–14 on the one hand and the wire-wound coil 16 on the other, or due to the thermobonding process during manufacture of the contactless IC card 10D. Therefore any breakage or parting of the end portions 16A, 16B of the wire-wound coil 16 can be prevented and the reliability of the contactless IC card 10D can be improved.

Additionally, because the buffer portion 20D contains no angled portion, stress does not accumulate in any part of the buffer portion 20D, thereby prolonging the working life of the wire-wound coil 16 and thus of the contactless IC card 10D itself.

A description will now be given of a fifth embodiment of the present invention, with reference to FIG. 9.

Figure 9:
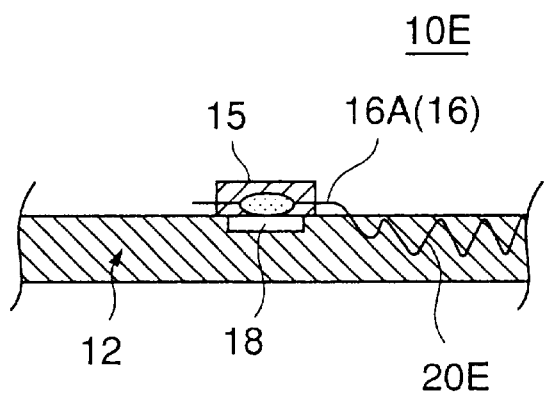
FIG. 9 is an expanded plan view of the module area of a contactless IC card according to a fifth embodiment of the present invention.

FIG. 9 is an expanded plan view of the module area of a contactless IC card 10E according to a fifth embodiment of the present invention.

As shown in FIG. 9, end portions 16A, 16B of the wire-wound coil 16 near the IC module 15 are twisted within the inlet laminate 12 itself so as to form a buffer portion 20E that absorbs tension generated within the wire-wound coil 16. Further, the twisted buffer portion 20E is formed so as to zigzag in a direction of a thickness of the inlet laminate 12. Further, the buffer portion 20E can be easily formed within the inlet laminate 12 by heating the inlet laminate 12 so that the inlet laminate 12 softens, at which point the end portions 16A, 16B of the wire-wound coil 16 are buried in the inlet laminate 12.

In the structure described above, the buffer portion 20E deforms so as to absorb any tension generated in the wire-wound coil 16 due to the coefficient of thermal expansion mismatch between each of the laminates 12–14 on the one hand and the wire-wound coil 16 on the other, or due to the thermobonding process during manufacture of the contactless IC card 10E. Therefore any breakage or parting of the end portions 16A, 16B of the wire-wound coil 16 can be prevented and the reliability of the contactless IC card 10E can be improved.

A description will now be given of a sixth embodiment of the present invention, with reference to FIG. 10.

Figure 10:
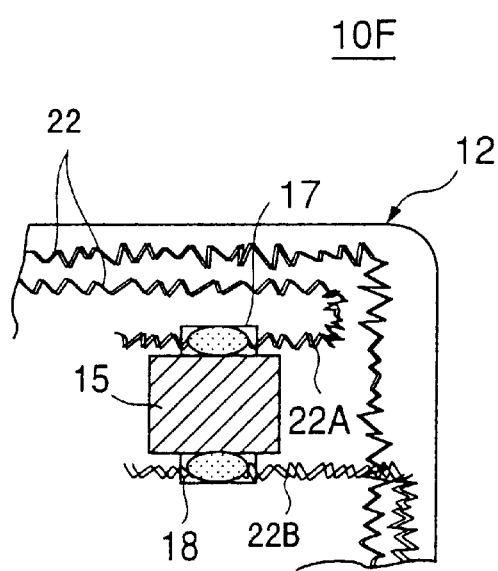
FIG. 10 is an expanded plan view of the module area of a contactless IC card according to a sixth embodiment of the present invention.

FIG. 10 is an expanded plan view of the module area of a contactless IC card 10F according to a sixth embodiment of the present invention.

As shown in the diagram, a wire that forms a wire-wound coil 22 is twisted so as to form a buffer portion.

It should be noted that, although in the present embodiment, the entire length of the wire that forms the wire-wound coil 22 is twisted, it is possible to twist just the end portions 22A, 22B of the wire that forms the wire-wound coil 22 and still achieve the same tension-absorbing effect as with the buffer portion formed along the whole length of the wire-wound coil 22.

Additionally, it should be noted that either one wire-wound coil 22 or a plurality of wire-wound coils 22 can be twisted to form the buffer portion of the present embodiment.

In the structure described above, the buffer portion, that is, the twisted portion of the wire-wound coil 22, can lengthen and contract as necessary, and thus deforms so as to efficiently absorb any tension generated in the wire-wound coil 22 due to the coefficient of thermal expansion mismatch between each of the laminates 12–14 on the one hand and the wire-wound coil 16 on the other, or due to the thermobonding process during manufacture of the contactless IC card 10F. Therefore any breakage or parting of the end portions 22A, 22B of the wire-wound coil 22 can be prevented and the reliability of the contactless IC card 10F can be improved.

Moreover, in addition to the above effect, the wire-wound coil 16 itself can be strengthened by using a plurality of wire-wound coils 22, thereby increasing the wire-wound coil 22 resistance to parting and prolonging the working life of the contactless IC card 10F.

A description will now be given of a sixth embodiment of the present invention, with reference to FIG. 11.

Figure 11:
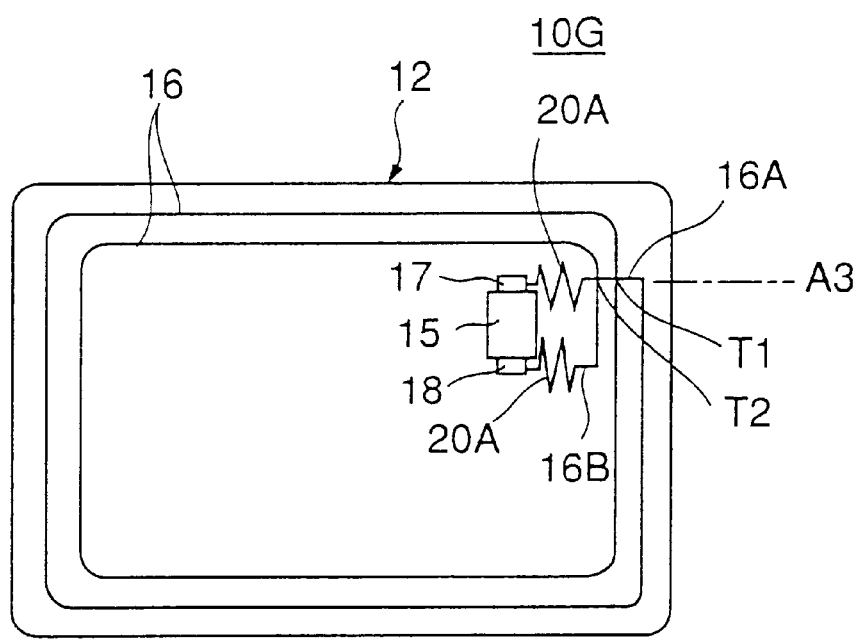
FIG. 11 is a view of an inlet laminate of a contactless IC card according to a seventh embodiment of the present invention.

FIG. 11 is a view of an inlet laminate of a contactless IC card 10G according to a seventh embodiment of the present invention.

As shown in the diagram, the IC card 10G according to a seventh embodiment of the present invention has essentially the same basic structure as the IC card 10A according to the first embodiment of the present invention as described above with reference to FIG. 4 and FIG. 5 with the exception of the structure of the connection of the end portions 16A, 16B of the wire-wound coil 16 to the IC module 15. A description of which connecting structure will now be given with reference to the conventional art as described above, in the first instance with reference to FIG. 2.

Figure 1:
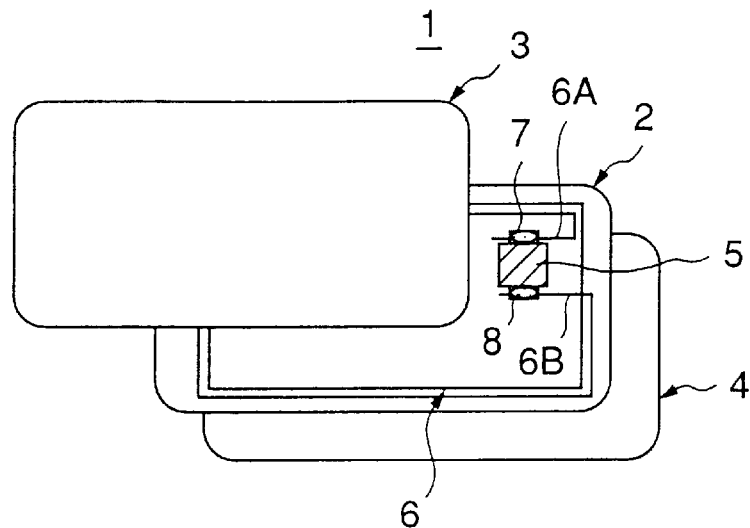
FIG. 1 is an exploded view of a conventional contactless IC card.
Figure 2:
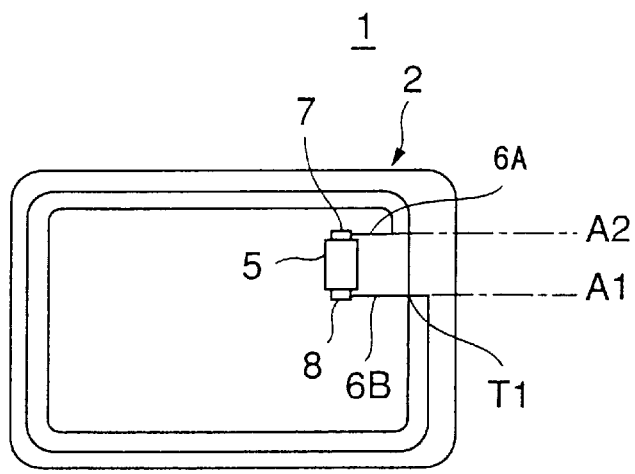
FIG. 2 is a top view of an inlet laminate of a conventional contactless IC card.
Figure 3:
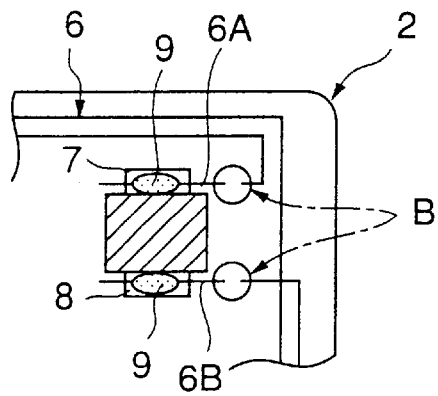
FIG. 3 is a diagram illustrating the problem with the conventional contactless IC card.

As shown in FIG. 2 and as described above, in the conventional art the end portions 6A, 6B of the wire-wound coil 6 are connected to the electrodes 7, 8 of the IC module 5. As also explained previously, the wire-wound coil 6 has the dual function of gaining power from an external device by a process of electromagnetic induction, and also of transmitting information to and receiving information from the external device. In particular, the wire-wound coil 6 must generate an electromotive force sufficient to stably drive the IC module 5 from the external device.

If, for example, the wire-wound coil 6 cannot generate such a sufficient electromotive force, then the distance over which the IC module 5 is able to transmit and receive information to and from the external device will be reduced, which is undesirable.

However, in the conventional contactless IC card 1 as described above, the issue of generating power from the wire-wound coil 6 gets short shrift compared to the emphasis placed on the function of the wire-wound coil 6 as an antenna for transmitting and receiving information, with conventional wire-wound coil 6 design consequently reflecting this emphasis. More specifically, adjusting the inductance of the wire-wound coil 6 has been emphasized in order to produce a certain resonance frequency.

For this reason, in the conventional contactless IC card 1 the wire-wound coil 6 is formed as less than two complete loops atop the inlet laminate 12 as shown in FIG. 2.

That is, as shown in the example depicted in FIG. 2, the wire-wound coil 6 is wound clockwise from a starting point (indicated as A1 in the diagram) and past (that is, beyond) an equivalent of the starting point (indicted as T1 in the diagram). However, the second turn is not completed but stops short of the starting point at a position indicated as A2 in the diagram, where the end portion 6A is connected to the electrode 7. Thus only the first turn of the wire-wound coil 6 of the conventional contactless IC card 1 shown in FIG. 2 forms a completely closed loop.

When generating an electromotive force in a coil by electromagnetic induction, the size of the electromotive force is determined by and proportional to the number of turns in the coil. Additionally, as can be determined from the diagram, the distance separating the starting point A1 shown in FIG. 2 from the point A2 at which the second turn bends to connect to the electrode 7 is essentially equivalent to a width of the IC module 5, this width being, in this case, approximately 8.0 mm. Extending this wire-wound coil 6 by this extent would not cause the inductance to change greatly, and it is easy to control the inductance simply by slightly changing the shape of the loop formed by the wire-wound coil 6.

By contrast, in the contactless IC card 10G according to a seventh embodiment of the present invention as shown in FIG. 11, taking the point A3 at which the end portion 16A of the wire-wound coil 16 turns to connect to the electrode 17 of the IC module 15 as the starting point, it can be seen that the wire-wound coil 16 makes two complete turns, that is, passes the starting point A3, before the end portion 16B connects to the electrode 18 of the IC module 15.

More specifically, the wire-wound coil 16 is wound clockwise from the starting point A3, makes a full loop on the first turn by passing the starting point A3, that is, passing beyond a point indicated as T1 in the drawing, and then continues on to complete another full loop on the second turn, with the end portion 16b of the wire-wound coil 16 turning to connect to the IC module 15 at a point beyond the point A3 in the direction in which the wire-wound coil 16 is wound, that is, beyond a point indicated as T2 in the diagram.

Therefore, according to the contactless IC card 10G of a seventh embodiment of the present invention, though the length of the wire-wound coil 16 is approximately the same as the length of the wire-wound coil 6 of the conventional contactless IC card 1 shown in FIG. 2, the wire-wound coil 16 of the contactless IC card 10G of a seventh embodiment is a coil that forms two complete loops, that is, turns, which enables the wire-wound coil 16 of the contactless IC card 10G of the seventh embodiment to generate a larger electromotive force than that of the wire-wound coil 6 of the conventional contactless IC card 1, which does not complete two full turns, thereby extending the range over which the contactless IC card 10G can communicate with the external device.

FIG. 12 is a chart illustrating the operation of the contactless IC card 10G according to the seventh embodiment of the present invention, and more specifically, showing the change in communication range with the change in the number of turns in the wire-wound coil 16, together with a similar change in the communication range with change in the number of turns in the wire-wound coil 6 of the conventional contactless IC card for purposes of comparison.

As can be seen from the chart, the embodiment of the contactless IC card 10G according to the seventh embodiment of the present invention shows a greater communication range than that of the conventional IC card for any given number of turns and resonance frequency. The added range of communication of the contactless IC card 10G of the present invention as compared to that of the conventional contactless IC card 1 is due, as mentioned earlier, to the increased electromotive force generated by the former as compared to the latter.

As can be appreciated by those skilled in the art, although the embodiments of the present invention have been described with reference to the contactless type of IC card, the present invention is equally adaptable to those so-called combination cards which can be used either as contact IC cards or contactless IC cards, due to the existence therein of wire-wound coils similar to the wire-wound coil of the contactless IC cards described above.

The above description is provided in order to enable any person skilled in the art to make and use the invention and sets forth the best mode contemplated by the inventors of carrying out the invention.

The present invention is not limited to the specifically disclosed embodiments, and variations and modifications may be made without departing from the scope and spirit of the present invention.

The present application is based on Japanese Priority Application No. 2000-261597, filed on Aug. 30, 2000, the contents of which are hereby incorporated by reference.

What is claimed is:

1. A contactless integrated circuit (IC) card comprising:
   one or more laminate members;
   a wire-wound coil, provided on one laminate member, receiving power and transmitting and receiving signals to and from an external device; and
   an IC module inputting and outputting the signals,
   the wire-wound coil being coupled to the IC module,
   an end portion of the wire-wound coil integrally forming a buffer portion in a vicinity where the wire-wound coil is coupled to the IC module so as to absorb tension generated in the wire-wound coil.

2. The contactless IC card as claimed in claim 1, wherein the buffer portion has substantially a wave-like form.

3. The contactless IC card as claimed in claim 1, wherein the buffer portion has substantially a U-shaped form.

4. The contactless IC card as claimed in claim 1, wherein the buffer portion is formed into a loop.

5. The contactless IC card as claimed in claim 1, wherein the buffer portion is formed so that the end portions thereof cross each other.

6. The contactless IC card as claimed in claim 1, wherein the buffer portion is submerged in twisted form in an intermediate one of the laminate members.

7. The contactless IC card as claimed in claim 1, wherein the buffer portion is twisted along a surface of the intermediate one of the laminate members.

8. The contactless IC card as claimed in claim 1, wherein the buffer portion extends along substantially the entire length of the wire-wound coil.

9. A contactless IC card system comprising:
   a contactless integrated circuit (IC) card having one or more laminate members, a wire-wound coil, provided on one laminate member, receiving power and transmitting and receiving signals to and from an external device, and an IC module inputting and outputting the signals, the wire-wound coil being coupled to the IC module, an end portion of the wire-wound coil integrally forming a buffer portion in a vicinity where the wire-wound coil is coupled to the IC module so as to absorb tension generated in the wire-wound coil; and
   an external reader/writer device that transmits power to the IC card and transmits information to and receives information from the IC card.

10. A combination card having one or more laminate members, a wire-wound coil, provided on one laminate member receiving power and transmitting and receiving signals to and from an external device, and an IC module inputting and outputting the signals, the wire-wound coil being coupled to the IC module, an end portion of the wire-wound coil integrally forming a buffer portion in the vicinity where the wire-wound coil is coupled to the IC module so as to absorb tension generated in the wire-wound coil.

11. The combination card as claimed in claim 10, wherein the buffer portion has substantially a wave-like form.

12. The combination card as claimed in claim 10, wherein the buffer portion has substantially a U-shaped form.

13. The combination card as claimed in claim 10, wherein the buffer portion is formed into a loop.

14. The combination card as claimed in claim 10, wherein the buffer portion is formed so that the end portions thereof cross each other.

15. The combination card as claimed in claim 10, wherein the buffer portion is submerged in twisted form in an intermediate one of the laminate members.

16. The combination card as claimed in claim 10, wherein the buffer portion is twisted along a surface of the intermediate one of the laminate members.

17. The combination card as claimed in claim 10, wherein the buffer portion extends along substantially the entire length of the wire-wound coil.

18. A contactless IC card system comprising:
a combination card having one or more laminate members, a wire-wound coil provided on one laminate member receiving power and transmitting and receiving signals to and from an external device, and an IC module inputting and outputting the signals, the wire-wound coil being coupled to the IC module, an end portion of the wire-wound coil integrally forming a buffer portion in the vicinity where the wire-wound coil is coupled to the IC module so as to absorb tension generated in the wire-wound coil; and
an external reader/writer device that transmits power to the IC card and transmits information to and receives information from the IC card.

19. A card comprising:
a first sheet member;
an antenna coil, provided on the first sheet member and having a pair of end portions, said antenna coil and said first sheet member being made of mutually different materials;
a circuit module, provided on the first sheet member and electrically coupled to the pair of end portions of the antenna coil, inputting a signal to and outputting a signal from the circuit module via the pair of end portions of the antenna coil; and
a buffer portion, provided at least in a vicinity of the pair of end portions of the antenna coil, absorbing thermal stress in the antenna coil,
said antenna coil integrally forming said buffer portion.

20. The card as claimed in claim 19, wherein said buffer portion substantially has a shape selected from a group consisting of a wave-like form, a U-shaped form and a loop.

21. The card as claimed in claim 19, wherein said first sheet member has a substantially rectangular shape, said antenna coil has a loop shape extending along an outer periphery of said first sheet member, and said buffer portion extends along substantially an entire loop shape of said antenna coil.

22. The card as claimed in claim 19, further comprising:
a second sheet member, provided on said first sheet member and covering said antenna coil, said circuit module and said buffer portion.

23. The card as claimed in claim 19, further comprising;
a second sheet member and a third sheet member sandwiching said first sheet member, so that said antenna coil, said circuit module and said buffer portion are covered by one of said second and third sheet members.

24. The card as claimed in claim 23, wherein said second and third sheet members are thermally bonded to said first sheet member, so that said antenna coil, said circuit module and said buffer portion are embedded in at least one of said first, second and third sheet members.

25. The card as claimed in claim 19, wherein said antenna coil integrally comprises said buffer portion.

* * * * *